United States Patent
Choi et al.

(10) Patent No.: US 6,169,657 B1
(45) Date of Patent: *Jan. 2, 2001

(54) RADIATING DEVICE FOR ELECTRONIC APPLIANCES

(75) Inventors: Kyeong-Sik Choi; Bong-Ho Choi, both of Daeku (KR)

(73) Assignee: LG Electronics Inc.(KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/196,552

(22) Filed: Nov. 20, 1998

(30) Foreign Application Priority Data

Mar. 6, 1998 (KR) ................................ 98-3210

(51) Int. Cl.[7] ..................................... H05K 7/20
(52) U.S. Cl. .................... 361/704; 361/707; 361/709; 361/710; 361/717; 361/718; 257/706; 257/712
(58) Field of Search ................... 361/704, 705, 361/707, 709–711; 257/706, 707, 718, 719; 174/16.3; 165/80.2, 80.3, 185

(56) References Cited

U.S. PATENT DOCUMENTS

| | | | | |
|---|---|---|---|---|
| 3,694,699 | * | 9/1972 | Snyder et al. | 361/705 |
| 4,609,040 | * | 9/1986 | Moore | 165/80.3 |
| 5,289,039 | * | 2/1994 | Ishida et al. | 257/796 |
| 5,567,986 | * | 10/1996 | Ishida | 257/707 |
| 5,625,229 | * | 4/1997 | Kojima et al. | 361/709 |
| 5,794,684 | * | 8/1998 | Jacoby | 165/80.3 |

\* cited by examiner

*Primary Examiner*—Leo P. Picard
*Assistant Examiner*—Boris L. Chervinsky
(74) *Attorney, Agent, or Firm*—Ostrolenk, Faber, Gerb & Soffen, LLP

(57) ABSTRACT

A radiating device for an electronic appliance is provided with a plurality of embossed portions at surfaces thereof and vents in the embossed portions, portions thereof which are not embossed or the embossed portions and the portions thereof which are not embossed. Thus, the radiating device according to the present invention protects other components of the electronic appliance which are not strong enough to endure heat by rapidly radiating the heat generated from a transistor or an integrated circuit.

2 Claims, 2 Drawing Sheets

RADIATING DEVICE FOR ELECTRONIC APPLIANCES

BACKGROUND OF THE INVENTION

1. Field of the Invention

The present invention relates to a radiating device for electronic appliances, and more particularly to a radiating device which is capable of protecting components of an electronic appliance which have a low degree of heat tolerance from heat by promptly emitting the heat generated by a transistor (hereinafter, called TR) or an integrated circuit (IC) of the electronic appliance.

2. Description of the Conventional Art

Usually, the TR (or IC) is employed as a main component of an electronic appliance. When operating, such TR (or IC) generates a high temperature which results in damaging other peripheral components of the electronic appliance which are not strong enough to endure the high temperature, and eventually leads to the improper operation or breakdown of the electronic appliance.

In order to prevent the other peripheral components from being damaged by the heat generated by the TR (or IC), a conventional electronic appliance has employed a radiating device which compulsorily emits the heat generated by the TR (or IC).

Such radiating device, however, has two types; one is a board type and the other is an extrusion type. In the board type 1, as can be seen in FIG. 1A, a body 1a is made of aluminuous materials to facilitate the heat radiation and a fastening hole 1b is provided in a center portion thereof, to which the TR (or IC) is fastened by a fixing member N such a screw, and thus the heat radiation is achieved through a surface of the body 1a.

Further, FIG. 1B shows the extrusion-type radiating device 1', wherein predetermined portions of the body 1a of the board type 1 are formed extruded to enlarge a radiation surface area thereof and thereby more effectively carry out the heat radiation.

However, in the board-type radiating device 1, when increasing the area or height of the device to improve a radiation effect, the manufacturing cost is accordingly increased. Also, due to the limitation of the area or height of other components provided in a chassis, since it is impossible to unlimitedly enlarge the size of the radiating device, the heat is radiated under a certain limit.

While, the radiation effect is improved in the extrusion-type radiating device 1', since the surface area thereof has been enlarged. However, the size of a product is undesirably increased by which the area occupied by the device 1' in the chassis is enlarged.

Also, the conventional board-type and extrusion-type radiating devices 1, 1' have another disadvantage of being not capable of safely protecting the other peripheral components in the electronic appliance from the heat, since the radiation is gradually performed by these devices.

SUMMARY OF THE INVENTION

Accordingly, the present invention is directed to a radiating device for an electronic appliance which obviates the problems and disadvantages due to the conventional art.

An object of the present invention is to provide a radiating device for an electronic appliance that is configured to be comparatively smaller than the conventional radiating device but of which radiation area to the unit area is maximized, thereby optimizing the radiation effect and rapidly carrying out radiation.

To achieve these and other advantages and in accordance with the purpose of the present invention, as embodied and broadly described, in a radiating device for an electronic appliance which radiates the heat generated by components of the electronic appliance, the improvement has a plurality of embossed portions and vents at surfaces thereof, wherein the vents are provided to facilitate the rapid radiation.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1A:
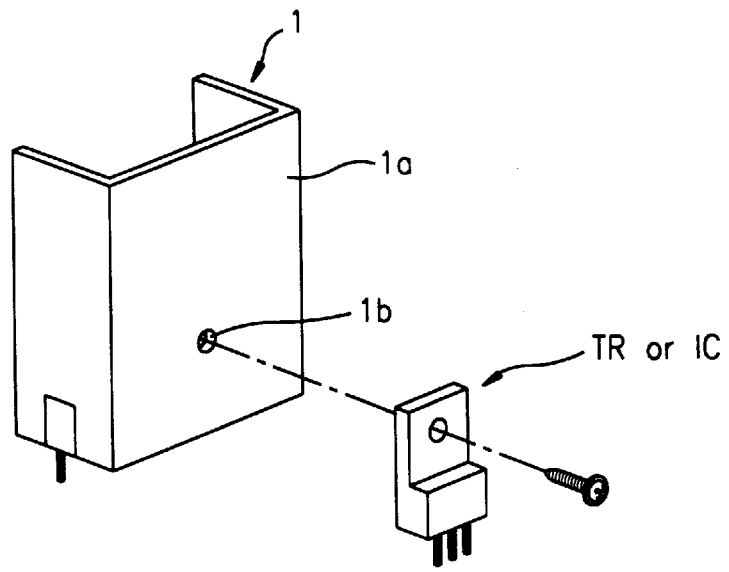
FIG. 1A is a perspective view of a conventional plate-type radiating device.
Figure 1B:
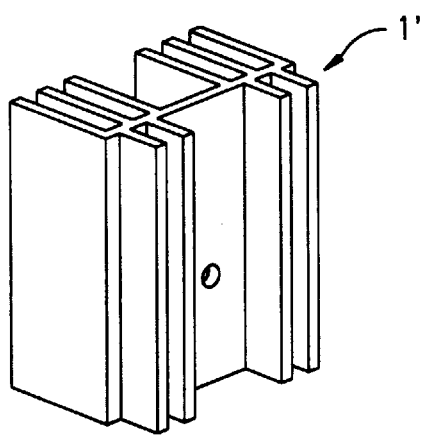
FIG. 1B is a perspective view of a conventional extrusion-type radiating device.
Figure 2:
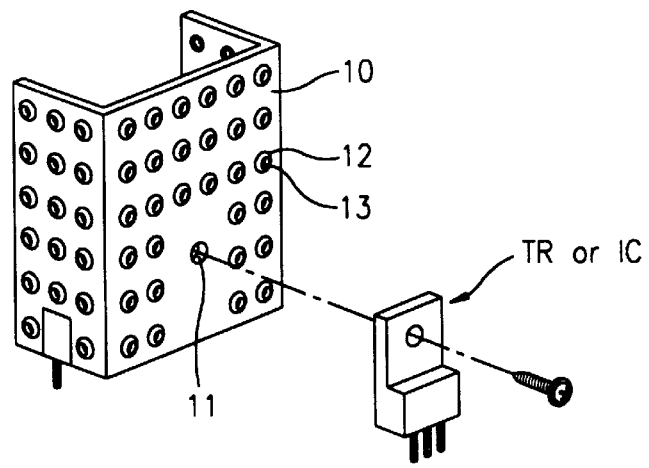
FIG. 2 is a perspective view which illustrates a radiating device according to the present invention.

Reference will now be made in detail to the preferred embodiments of the present invention, examples of which are illustrated in the accompanying drawings. As can be seen in FIG. 2, a radiating device according to the present invention has a plurality of embossed portions 12 at surfaces of a body 10 of the device.

Figure 3A:
FIG. 3A is a cross-sectional view illustrating that vents are formed in embossed portions of the radiating device according to the present invention.

In addition, as shown in FIG. 3A, a vent 13 is provided in a center portion of each of the embossed portions 12 to facilitate air ventilation.

Figure 3B:
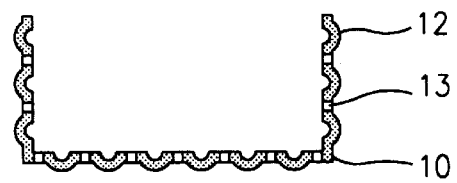
FIG. 3B is a cross-sectional view illustrating that vents are formed in portions of the radiating device which are not embossed in the present invention.
Figure 3C:
FIG. 3C is a cross-sectional view illustrating that vents are formed in portions of the radiating device which are not embossed as well as embossed in the present invention.

Further, the vents 13 can be alternatively formed at parts of the body which are not embossed, or at all the parts, that is the parts which are embossed as well as not embossed. The thusly described types are illustrated in FIGS. 3B and 3C, respectively.

Wherein, 11 denotes a hole through which the TR (or IC) is coupled to the body 10. Now, the operation of the radiating device for the electronic appliance according to the present invention will be described.

The heat which has been generated from the TR (or IC) due to the operation of the electronic appliance is transmitted to the body 10 which is fixedly coupled to the TR and radiated through the embossed portions 12 of the body 10. Here, it is noted that ventilation is achieved through the plurality of vents 13 provided at the body 10, to thereby promptly facilitate the radiation.

Wherein, since the radiation effect is produced proportioned to a surface area of the radiation device, though reducing the size of the body 10 thereof as compared with the conventional art the surface area thereof is enlarged at its maximum by virtue of the embossed portions which are provided at the body 10 with predetermined thickness and pitch.

Further, the ventilation can be achieved through the vents 13 which can be formed in the embossed portions, the portions which are not embossed or the embossed portions and the portions which are not embossed, thus the radiation of the radiating device of the present invention has a relatively rapid speed.

As described above, the radiating device for the electronic appliance according to the present invention with the plurality of embossed portions thereof can maximize the radiation effect per each unit area. Therefore, although reduced in size, the radiating device according to the present invention has the radiation effect which has been considerably improved as compared with the conventional art, as well as has an advantage of reducing the manufacturing cost.

Further, in the radiating device, since the vents are provided at the embossed portions, the portions which are not embossed or the embossed portions and the portions which are not embossed, the ventilation of the radiation device is more smoothly obtained, thereby achieving the rapid radiation and safely protecting the other components of the electronic appliance from the heat generated by the TR (or IC).

It will be apparent to those skilled in the art that various modifications and variations can be made in the radiating device for the electronic appliances of the present invention without departing from the spirit or scope of the invention. Thus, it is intended that the present invention cover the modifications and variations of this invention provided they come within the scope of the appended claims and their equivalents.

What is claimed is:

1. An integrated radiating device affixed to an electronic device which radiates heat generated by components thereof, the integrated radiating device comprising heat radiating surfaces and a plurality of embossed portions at said surfaces thereof, said radiating surfaces and said embossed portions being integrally formed and a plurality of vents being provided at the embossed portions.

2. The device according to claim 1, wherein a plurality of vents are provided at the heat radiating surfaces which are not embossed.

* * * * *